United States Patent [19]

Zettler et al.

[11] Patent Number: 5,422,309

[45] Date of Patent: Jun. 6, 1995

[54] METHOD FOR PRODUCING A METALLIZATION LEVEL HAVING CONTACTS AND INTERCONNECTS CONNECTING THE CONTACTS

[75] Inventors: Thomas Zettler; Ulrich Scheler, both of Munich, Germany

[73] Assignee: Siemens Aktiengesellschaft, Munich, Germany

[21] Appl. No.: 167,020

[22] Filed: Dec. 16, 1993

[30] Foreign Application Priority Data

Jan. 19, 1993 [DE] Germany .................. 43 01 260.4

[51] Int. Cl.6 ........................................ H01L 21/441
[52] U.S. Cl. .................................. 437/192; 437/229; 148/DIG. 50
[58] Field of Search .................. 437/187, 192, 229; 148/DIG. 20, DIG. 50

[56] References Cited

U.S. PATENT DOCUMENTS

| | | | |
|---|---|---|---|
| 4,789,648 | 10/1988 | Chow et al. | 437/195 |
| 4,944,836 | 7/1990 | Beyer et al. | 156/645 |
| 4,987,099 | 1/1991 | Flanner | 437/192 |
| 5,262,354 | 11/1993 | Cote et al. | 437/192 |

FOREIGN PATENT DOCUMENTS

WO9209102  5/1992  WIPO .

OTHER PUBLICATIONS

"Dual Damascene: A ULSI Wiring Technology" by Kaanta, et al., IEEE, Jun. 11-12, 1991 VMIC Conference, pp. 144-152.
"Reverse Pillar And Maskless Contact—Two Novel Recessed Metal Schemes And Their Comparisons To Conventional VLSI Metallization Schemes" by Yeh, et al., IEEE, Jun. 13-14, 1988 V-MIC Conference, pp. 95-100.
"A Submicron CMOS Two Level Metal Process With Planarization Techniques" by Fritsch, et al., IEEE, Jun. 13-14, 1988 V-MIC Conference, pp. 69-75.
"Submicron Wiring Technology With Tungsten And Planarization" by Kaanta, et al., IEEE, Jun. 13-14, 1988 V-MIC Conference, pp. 21-28.
"Damascene Process For Simultaneoulsy Inlaying Tungsten Into Lines And Contacts", IBM Technical Disclosure Bulletin, vol. 34, No. 7A, Dec. 1991, N.Y., USA, pp. 1-2.
"Tungsten Plug Formation By An Optimized Tungsten Etch Back Process In Non-Fully Planarized Topology" by Koller, et al., Applied Surface Science 53 (1991), pp. 54-61.
"Reliability Issues Of Metal-Line/Tungsten Stud Overlap Areas" by Miller, et al., Jun. 9-10, 1992 VMIC Conference, pp. 398-400.
"High Density Damascene Wiring And Borderless Contacts For 64 M DRAM" by Roehl, et al., Jun. 9-10, 1992 VMIC Conference, pp. 22-28.
"Chemical Amplification Of Resist Lines (CARL)" by Sebald, et al, Microelectronic Engineering 11 (1990) pp. 531-534.
"Chemical Amplification Of Resist Lines (CARL) A Novel Sub-Halfmicron Bilayer Resist Technique For NUV And Deep UV Lithography" by Sebald, et al., Advances in Resist Technology and Processing VII, vol. 1262 (1990), pp. 528-537.
"Electromigration Characteristics of AL/W Via Contact Under Unidirectional And Bidirectional Current Conditions" by Tao, et al., IEEE, Jun. 11-12, 1991 VMIC Conference, pp. 390-392.
"A Four-Level-Metal Fully Planarized Interconnect Technology For Dense High Performance Logic And SRAM Applications" by Uttecht, et al., IEEE, Jun. 11-12, 1991 VMIC Conference, pp. 20-26.

*Primary Examiner*—Chandra Chaudhari
*Attorney, Agent, or Firm*—Hill, Steadman & Simpson

[57] ABSTRACT

An insulating layer wherein contact holes to regions to be contacted are opened is applied surface-wide onto a substrate. For producing an interconnect mask, a photoresist layer is applied, exposed and developed such that the surface of the regions to be contacted remains covered with photoresist in exposed regions, whereas the surface of the insulating layer is uncovered in the exposed regions. Using the interconnect mask as etching mask, trenches are etched into the insulating layer. Contacts and interconnects of a metallization level are finished by filling the contact holes and the trenches with metal.

19 Claims, 2 Drawing Sheets

METHOD FOR PRODUCING A METALLIZATION LEVEL HAVING CONTACTS AND INTERCONNECTS CONNECTING THE CONTACTS

BACKGROUND OF THE INVENTION

1. Field of the Invention

The present invention is directed to a method for producing a metallization level having interconnects and contacts connecting the interconnects to a substrate.

2. Description of the Prior Art

Wiring with ongoing miniaturization is increasingly gaining in significance for the reliability and the performance of integrated circuits. Given miniaturization of the gate length, MOS transistors enable higher saturation currents. The maximally allowable current through a contact or through an interconnect, however, becomes smaller given miniaturization of the cross section thereof.

Problems in the wiring arise particularly due to Joule effect in conductor regions having high resistance given high current densities. In interaction with electromigration, the wiring can even be completely destroyed (see, for example, L. A. Miller, et al., VMIC 1992 Conf. Proc. 398, IEEE Catalog No. 92ISMIC-101, J. Tao et at., VMIC 1991 Conf. Proc. 390, IEEE Catalog No. 91TH0359-0). In order to avoid this, particular care must be exercised to avoid high and non-uniform electrical resistances in a wiring process that should be suitable for dimensions in the 0.25 μm range because of the high current densities that occur therein.

Numerous methods for manufacturing wiring or metallization levels are known from the literature. A metallization level has conductor runs forming interconnects on an insulating layer which physically separate the conductor runs (interconnects) from the substrate. The conductor runs can be electrically connected to the substrate by means of filled contact holes in the insulating layer to form contacts.

U. Fritsch et al., VMIC 1988, Conf. Proc. 21, IEEE Catalog No. 88CH2624-5 discloses that a planarizing SiO2 layer be applied on a substrate surface that has gate electrodes. Contact holes are opened in the SiO2 layer. A thin Ti/TiN layer is sputtered thereon surface-wide and the contact holes are filled with tungsten. Interconnects are produced thereon by surface-wide sputtering of an aluminum layer that contains silicon and titanium and by structuring the AlSiTi and Ti/TiN layers. Subsequently, an oxide layer that is planarized is applied surface-wide. A boundary surface of materials arises in this process between the contact hole fill and the interconnect, which leads to a transition or contact resistance.

Uttecht et at., VMIC 1991 Conf. Proc. 20, IEEE Catalog No. 91TH0359-0 discloses a method for producing wiring levels wherein the contacts are produced independently of the interconnects. The contacts are formed of tungsten and the interconnects are formed of an aluminum alloy. For increasing the packing density, it is permitted in this method that the interconnect only partially cover the contacts. Alignment imprecisions in the manufacture of the interconnect thus act directly on the cross section of the boundary surface between contact and interconnect. Over and above this, transition or contact resistances are formed at this boundary surface.

C. W. Kaanta et al., VMIC 1991 Conf. Proc. 144, IEEE Catalog No. 91TH0359-0 discloses a method for manufacturing a wiring level wherein both the contacts as well as the interconnects are produced in one process step by deposition of tungsten. A boundary surface between the contacts and the interconnects is thereby avoided. The interconnects are subsequently formed by structuring the tungsten layer located at the surface. In this structuring, an alignment imprecision leads to a reduction of the filled contact cross section.

J. L. Yeh et al., VMIC 1988 Conf. Proc. 95, IEEE Catalog No. 88CH2624-5 discloses a method wherein, given employment of an etching stop layer and of two photolithography steps, an opening that represents the negative of the contacts and of the interconnects is produced in a dielectric layer. The contacts and the interconnects are formed by filling this opening with metal. A boundary surface between contact and interconnect is thereby avoided. The overlap between contact and interconnect amounts to 100% as a result of self-alignment. The structural fineness, however, is limited by self-alignment edges of the masks. Alignment imprecisions in this process lead to constriction of the contacts and size reduction of the transition area between interconnect and contact.

Further, the reference of Yeh et al., VMIC 1988 Conf. Proc. 95, IEEE Catalog No. 88CH2624-5 discloses another method for producing a wiring level. Trenches that have the course of the interconnects are thereby etched in a dielectric layer that is provided with an etch stop. These trenches are filled up by a conformally deposited metal layer. The trenches are widened at locations at which contacts are to be formed, so that the conformally deposited metal layer does not completely fill up the trenches at these locations. During the anisotropic re-etching of the metal layer, the bottom surfaces of the trenches are exposed in the widened regions and spacers arise at the walls of the trenches. These spacers are used as a self-aligned etching mask for producing a contact hole by removing the dielectric layer at the floor of the trench. Subsequently, the contact holes are filled with metal. In this method, the packing density cannot be arbitrarily reduced, since a widening of the interconnects is required for producing the contacts.

S. Roehl et al., VMIC 1992 Conf. Proc. 22, IEEE Catalog No. 92ISMIC-101 discloses a method for producing a wiring level wherein the contacts and the interconnects are separately produced. As a result thereof, a boundary surface that leads to a transition or contact resistance is formed. In this method, imprecisions in alignment directly influence the overlap between interconnect and contact.

C. W. Kaanta et al., VMIC 1991 Conf. Proc. 144, IEEE Catalog No. 91TH0359-0 discloses a method for producing a wiring level wherein a dielectric layer is applied onto a planar substrate surface, a contact hole mask being formed on this dielectric layer and an interconnect mask being formed on this contact hole mask. By step-by-step, selective etching, the contact holes are etched first and, after the structure of the interconnect mask has been transferred into the contact hole mask in a further etching step, the interconnects are then etched. Finally, contacts and interconnects are filled by metal deposition. Overlap between contact and interconnect is assured in this method on the basis of self-alignment. Imprecisions in alignment in this method, however, lead to a constriction of the contacts and to a reduction in size of the transition area between interconnect and contact.

U.S. Pat. No. 4,789,648 discloses a method for producing a wiring level wherein an etch stop mask at the surface of a dielectric layer is structured with the assistance of a contact hole mask. Subsequently, another dielectric layer is deposited surface-wide. The upper dielectric layer is structured with the assistance of an interconnect mask. Exposed parts of the lower dielectric layer are thereby also etched away. Due to the etching stop layer, the interconnect pattern is transferred only into the upper dielectric layer. Subsequently, contacts and interconnects are finished by being filled with metal. The arrangement of the interconnects relative to the contacts ensues self-aligned. Imprecisions in alignment, however, lead to the fact that the contacts are constricted and the transition area between interconnect and contact is reduced in size.

SUMMARY OF THE INVENTION

It is an object of the present invention to provide a method for producing a metallization level, whereby a boundary surface between interconnect and contact is avoided. It is a further object to provide a method of the type initially cited, wherein a 100% overlap of interconnect and contact is assured, and a constriction of the conductive contact cross-section is avoided. Another object is preservation of the planarity of the surface.

The object of the present invention is achieved in a method for producing a metallization level on a substrate comprising the steps of: applying an insulating layer surface-wide onto a substrate surface; opening contact holes in the insulating layer at selected locations corresponding to regions of the substrate surface at which a contact to the substrate surface is desired; producing an interconnect mask by covering the insulating layer with a photoresist layer which also fills the contact holes and exposing and developing the photoresist layer to leave the contact holes filled with photoresist and to uncover an area of said insulating layer adjacent the contact holes corresponding to a desired expanse of an interconnect for the contacts; using the interconnect mask as a mask for etching away the insulating layer in the area to produce a trench; and removing the photoresist and filling the trench and the contact holes with metal to form an interconnect in each trench and a contact in each contact hole.

Despite any definitional difference that may exist with the summaries of the art described above, in the present invention, an "interconnect" is defined as the portion of the metallization level residing above the substrate and formed in the trench. Whereas a "contact" is defined as the portion of the metallization level that is in contact with the substrate, provides for electrical conductivity from the substrate to the upper surface of the metallization level, and is formed in the contact hole.

In the method of the invention, an insulating layer is applied surface-wide onto a substrate that has regions to be contacted at its surface. Contact holes are opened in the insulating layer, and the surface of the regions to be contacted is exposed in these interconnect holes. For producing an interconnect mask, a photoresist layer is applied surface-wide and is exposed in accord with the course of the interconnects. The photoresist layer is subsequently developed such that the surface of the regions to be contacted in the contact holes remains covered with photoresist in exposed regions, whereas the surface of the insulating layer is uncovered in the exposed regions. This is achieved, for example, by an appropriately shortened developing time of the photoresist.

Using the interconnect mask as an etching mask, trenches with a depth corresponding to the expanse of the interconnects are etched into the insulating layer. After the removal of the interconnect mask, the contact holes and the trenches are filled with metal for forming the contacts and the interconnects that form the metallization level.

The method of the invention is especially advantageous to use when the photoresist layer for producing the interconnect mask is formed of a dry-developing resist. In this case, the apparatus wherein the development takes place is disconnected as soon as an adequate development has been achieved.

In the method of the invention, the interconnect is formed by the superposition of areas defined by interconnect mask and contact mask. In this way, a constriction of the conductive contact cross section is avoided and, at the same time, a 100% overlap of interconnect and contact at the transition location is assured. A boundary surface between contact and interconnect is avoided by filling the trenches and the contact holes in one process step. Finally, conditioned by the process, contact and interconnect are completely buried in the dielectric layer, so that the planarity of the surface is not deteriorated by the process.

It lies within the framework of the invention for filling the contact holes and trenches to deposit a conformal metal layer surface-wide that is subsequently removed outside the interconnects. When the insulating layer has an essentially planar surface, chemical-mechanical polishing, for example, as disclosed by U.S. Pat. No. 4,944,836 is suitable for this purpose.

When the interconnects have a width in an expanse parallel to the surface of the substrate that is less than about twice the value of the depth of the trenches, then the metal layer outside the contacts and interconnects can be removed by mask-free, anisotropic etching.

BRIEF DESCRIPTION OF THE DRAWINGS

The invention shall be set forth in greater detail below with reference to an exemplary embodiment and to the figures.

DESCRIPTION OF THE PREFERRED EMBODIMENT

Figure 1:
FIG. 1 shows a substrate having a dielectric layer of the present invention.

A dielectric layer 2 of, for example, $SiO_2$ is applied onto a substrate 1 that has active switch elements and whose surface has regions to be contacted (see FIG. 1). The dielectric layer 2, for example, is formed by deposition of a 150 nm thick, undoped CVD-$SiO_2$ and by subsequent deposition of a 1200 nm thick BPSG CVD-$SiO_2$ and subsequent flowing. The flowing occurs, for example, in a brief duration temperature step at 1072° C. over 10 seconds.

Figure 2:
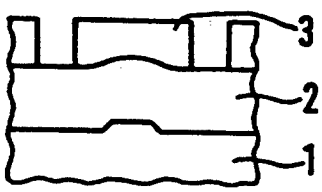
FIG. 2 shows an contact hole mask at the surface of the dielectric layer of the present invention.

A contact hole mask 3 is produced on the dielectric layer 2 (see FIG. 2). To that end, for example, a two-layer resist of a type known from M. Sebald et al., Microelectronic Engineering 11, 531, 1990 and M. Sebald et al., SPIE Vol. 1262, Advances in Resist Technology and Processing VII, 528, 1990, is used. A two-layer resist has a bottom resist and a top resist. The surface of the dielectric layer 2 is lacquered with the bottom resist and is heated. Lacquering with the top resist follows. An I-line exposure, developing and silylization also follow. Subsequently, the contact hole mask 3 is produced by dry development in an $O_2$ plasma. The dry development occurs, for example, over 180 seconds. Resist type TSMR-8900 (manufactured by Tokyo Ohka Kogyo Company, Ltd) may be used as a bottom resist and type CP-365-A (manufactured by Siemens AG/Hoechst AG) may be used as a top resist.

Figure 3:
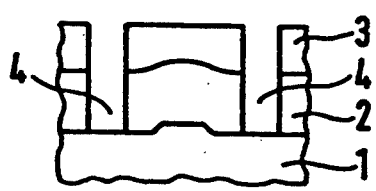
FIG. 3 shows the substrate after the contact hole etching of the present invention.

Contact holes 4 are opened in the dielectric layer 2 in an anisotropic etching process (see FIG. 3). The surface of the substrate 1 is uncovered in the region of the contact holes 4. The contact hole etching occurs, for example, in a $CH/F_3/O_2$ plasma over 25 minutes.

Figure 4:
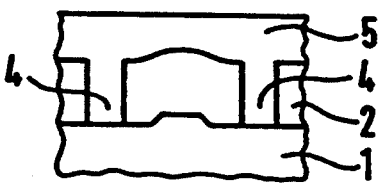
FIG. 4 shows the substrate after deposition of the photoresist layer for forming the interconnect mask of the present invention.
Figure 9:
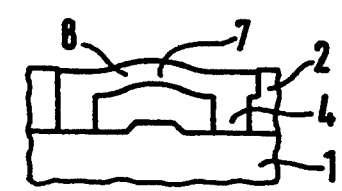
FIG. 9 shows the substrate after the removal of the metal layer outside the contact holes and trenches of the present invention.

After the removal of the contact hole mask, a photoresist layer 5 is applied surface-wide (see FIG. 4). The photoresist layer 5, for example, is likewise formed of a two-layer resist system as disclosed by M. Sebald et at., Microelectronic Engineering 11,531 1990 and M. Sebald et at., SPIE Vol. 1262, Advances in Resist Technology and Processing VII, 528, 1990. The surface of the photoresist layer 5 is essentially planar. The photoresist layer 5 is formed by lacquering with the bottom resist, heating the bottom resist and lacquering with the top resist.

Figure 5:
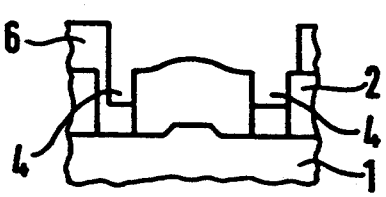
FIG. 5 shows the substrate with the interconnect mask of the present invention.

An interconnect mask 6 is produced by I-line exposure, development and silylization and by subsequent dry developing in an $O_2$ plasma (see FIG. 5). The dry developing in the $O_2$ plasma is conducted only until the surface of the insulating layer in the exposed region is uncovered. By contrast, photoresist remains at the floor of the contact holes 4.

The interconnect mask 6 can also be formed of other photoresist types in addition to being formed of said photoresist. The photoresist types can be developed in a controlled fashion in conformity with the demands of the particular application.

Figure 6:
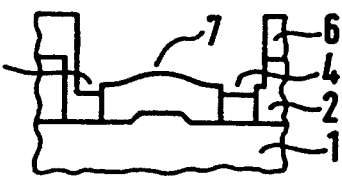
FIG. 6 shows the substrate after the trench etching of the present invention.

Using the interconnect mask 6 as an etching mask, the uncovered portion of the insulating layer 2 is etched back in an anisotropic etching process (see FIG. 6). Trenches 7 that overlap the contact holes 4 thereby arise.

Figure 7:
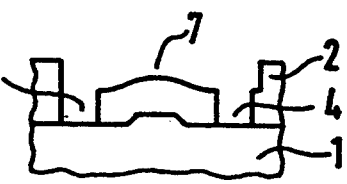
FIG. 7 shows the substrate after the removal of the interconnect mask of the present invention.

After removing the interconnect mask 6, a contact hole pattern and a trench pattern are formed in the insulating layer 2 which represent the negative of the contacts and interconnects to be produced. This pattern covers the overlap of the contact hole mask and the interconnect mask. Given a slight alignment imprecision of the interconnect mask 6 relative to the edges of the contact holes, as shown, for example, in FIG. 6, the width of the individual contact holes 4 is preserved (see FIG. 7). The contact hole 4 shown at the left, which was partially covered by the interconnect mask 6 (see FIG. 6), has the same width in its lower region as the contact hole 4 shown at the right. The alignment imprecision of the interconnect mask 6 at the right-hand contact hole 4 (see FIG. 6) causes a broadening of the trench. A 100% overlap of the trench 7 over both contact holes 4 is established in any case.

Figure 8:
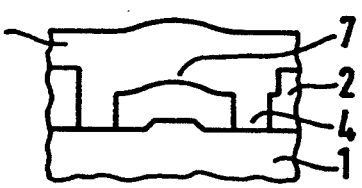
FIG. 8 shows the substrate after the deposition of a metal layer of the present invention.

For finishing the metallization level, a surface-wide deposition of a conformal metal layer 8 follows (see FIG. 8). To that end, for example, an adhesion layer of 20 nm Ti and 100 nm TiN is applied, for example by sputtering. A CVD tungsten deposition follows the tempering of the adhesion layer at, for example, 715° C. over 20 seconds in a $N_2$ atmosphere.

For finishing the metallization level, the metal layer is etched back outside the trenches 7 and the contact holes 4. The re-etching of the metal layer 8 occurs in situ in $SF_6$ immediately after the tungsten deposition. The process disclosed by K. Koller et al., Applied Surface Science 53, 54, 1991, for example, is particularly suitable for the tungsten deposition. Finally, the adhesion layer is re-etched until the surface of the insulating layer 2 is uncovered outside the trenches 7 and the contact holes 4. The portion of the metal layer 8 remaining in the contact holes 4 forms the contacts; that portion of the metal layer 8 remaining in the trenches 7 forms the interconnects.

Figure 10:
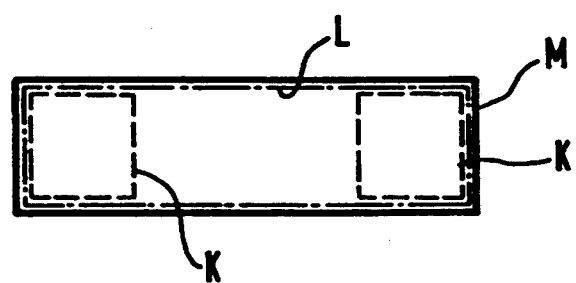
FIG. 10 shows a plan view onto a contact hole mask and onto an interconnect mask that are perfectly aligned relative to one another of the present invention.

The overlap of a contact hole mask K and an interconnect mask L is discussed below with reference to FIGS. 10 and 11. The contact hole mask K is shown with broken-line contours. The interconnect mask L is shown by dot-dash contours. FIG. 10 shows the case where the contact hole mask K and the interconnect mask L are ideally aligned relative to one another. The interconnect mask L has the same width as the contact holes and is arranged above the contact hole mask K. In the method of the invention, this arrangement of the contact hole mask and of the interconnect mask L leads to a cross section of the metallization M shown as a solid-line contour.

Figure 11:
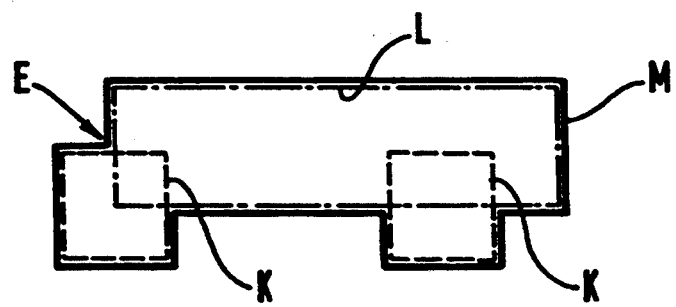
FIG. 11 shows a plan view onto a contact hole mask and an interconnect mask that are de-adjusted relative to one another of the present invention.

FIG. 11 shows a certain de-alignment of the contact hole mask K and of the interconnect mask L, which is unavoidable in practice. The contact hole mask K is again entered as a broken-line contour, the interconnect mask L is entered as a dot-dash contour, and the cross section of the metallization that derives is entered as a solid line M. The cross section of the metallization M derives as an overlap of the contact hole mask K and the interconnect mask L. Neither the cross section of the contact hole nor the cross section of the interconnect is reduced in size. On the contrary, when a contact hole lies at the edge of an interconnect, then the cross section of the interconnect is widened by the projection of the contact hole. In this case, a 100% overlap between contact and interconnect is assured. A constriction of the flow of current in the case where a contact is arranged at the end of an interconnect can only occur when the interconnect mask is shifted relative to the contact hole mask K both in the z-direction as well as in the y-direction. This case is referenced in FIG. 11 with the arrow E.

Although other modifications and changes may be suggested by those skilled in the art, it is the intention of the inventors to embody within the patent warranted hereon all changes and modifications as reasonably and properly come within the scope of their contribution to the art.

We claim:

1. A method for producing a metallization level on a substrate comprising the steps of:
    applying an insulating layer surface-wide onto a substrate surface;
    opening contact holes in said insulating layer at selected locations corresponding to regions of said substrate surface at which a contact to said substrate surface is desired;
    producing an interconnect mask by covering said insulating layer with a photoresist layer which also fills said contact holes and exposing and developing said photoresist layer to leave said contact holes filled with photoresist and to uncover an area of said insulating layer adjacent to said contact holes in which an interconnect for said contact is to be produced;
    using said interconnect mask as a mask for etching away said insulating layer in said area of said insulating layer adjacent to said contact holes in which an interconnect for said contact is to be produced to produce a trench; and
    removing said photoresist and filling said trench and said contact holes with metal to produce said interconnect in each trench and a contact in each contact hole.

2. Method according to claim 1, further comprising the steps of:
    etching through said insulating layer in one etch step for the formation of said contact holes upon employment of a contact hole mask, and
    removing said contact hole mask before formation of said interconnect mask.

3. Method according to claim 1, further defined by forming said photoresist layer for producing said interconnect mask of a dry-developing resist.

4. Method according to claim 3, further defined by providing said photoresist mask having a two-layer system with a bottom layer and a top layer, further comprising the steps of:
    after exposure, developing and silylizing said top layer, and dry-developing said bottom layer such that a quantity of photoresist remains undeveloped as a fill in said contact holes as a result of an abbreviated developing time period of said dry-developing.

5. Method according to claim 4, further defined by conducting said dry-developing in an $O_2$ plasma.

6. Method according to claim 4, further defined by providing said bottom layer with a planarizing, absorbent and photo-insensitive resist and said upper layer with a photo-sensitive resist.

7. Method according to claim 1, further comprising the steps of:
    depositing a conformal metal layer surface-wide for filling said contact holes and trenches, and
    subsequently removing said conformal metal layer from outside said contacts and interconnects.

8. Method according to claim 7, further defined by providing said insulating layer with an essentially planar surface, and conducting said removing step by chemical-mechanical polishing.

9. Method according to claim 7, said removing step further defined by conducting a mask-free, anisotropic etching when the width of said interconnects is less than twice the value of the depth of said trenches.

10. Method according to claim 7, further defined by conducting said depositing step by conformal deposition of tungsten.

11. Method according to claim 2, further defined by forming said photoresist layer for producing said interconnect mask of a dry-developing resist.

12. Method according to claim 5, further defined by providing said bottom layer with a planarizing, absorbent and photo-insensitive resist and said upper layer with a photo-sensitive resist.

13. Method according to claim 2, further comprising the steps of:
    depositing a conformal metal layer surface-wide for filling said contact holes and trenches, and
    subsequently removing said conformal metal layer from outside said contacts and interconnects.

14. Method according to claim 3, further comprising the steps of:
    depositing a conformal metal layer surface-wide for filling said contact holes and trenches, and
    subsequently removing said conformal metal layer from outside said contacts and interconnects.

15. Method according to claim 4, further comprising the steps of:
    depositing a conformal metal layer surface-wide for filling said contact holes and trenches, and
    subsequently removing said conformal metal layer from outside said contacts and interconnects.

16. Method according to claim 5, further comprising the steps of:
    depositing a conformal metal layer surface-wide for filling said contact holes and trenches, and
    subsequently removing said conformal metal layer from outside said contacts and interconnects.

17. Method according to claim 6, further comprising the steps of:
    depositing a conformal metal layer surface-wide for filling said contact holes and trenches, and
    subsequently removing said conformal metal layer from outside said contacts and interconnects.

18. Method according to claim 8, further defined by conducting said depositing step by conformal deposition of tungsten.

19. Method according to claim 9, further defined by conducting said depositing step by conformal deposition of tungsten.

* * * * *